(12) United States Patent
Su et al.

(10) Patent No.: US 12,463,049 B2
(45) Date of Patent: Nov. 4, 2025

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Bo Su, Shanghai (CN); Zhenyang Zhao, Shanghai (CN); Haiyang Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 406 days.

(21) Appl. No.: 18/128,431

(22) Filed: Mar. 30, 2023

(65) Prior Publication Data
US 2023/0238245 A1    Jul. 27, 2023

Related U.S. Application Data

(63) Continuation of application No. PCT/CN2020/117828, filed on Oct. 16, 2020.

(51) Int. Cl.
*H01L 21/308* (2006.01)
*H10D 62/17* (2025.01)
(Continued)

(52) U.S. Cl.
CPC ...... *H01L 21/3088* (2013.01); *H01L 21/3085* (2013.01); *H01L 21/3086* (2013.01);
(Continued)

(58) Field of Classification Search
CPC ............. H01L 21/3085; H01L 21/3086; H01L 21/3088; H10D 30/01; H10D 30/0191–0194; H10D 30/024; H10D 30/0241; H10D 30/0243; H10D 30/501–509; H10D 30/62; H10D 62/292; H10D 84/01; H10D 84/0128;
(Continued)

(56) References Cited

U.S. PATENT DOCUMENTS

2020/0027735 A1*    1/2020   Wang ................. H01L 21/3086

* cited by examiner

*Primary Examiner* — Cheung Lee
(74) *Attorney, Agent, or Firm* — Crowell & Moring LLP

(57) ABSTRACT

Semiconductor structures and forming methods are disclosed. One form of a method includes: forming mask spacers on a base; patterning a target layer using the mask spacers as masks, to form discrete initial pattern layers, where the initial pattern layers extend along a lateral direction and grooves are formed between a longitudinal adjacent initial pattern layers; forming boundary defining grooves that penetrate through the initial pattern layers located at boundary positions of the target areas and cutting areas along the lateral direction; forming spacing layers filled into the grooves and the boundary defining grooves; and using the spacing layers located in boundary defining grooves and the spacing layers located in the grooves as stop layers along the lateral and the longitudinal directions respectively, etching the initial pattern layers located in the cutting areas, and using the remaining initial pattern layers located in the target areas as the target pattern layers.

21 Claims, 8 Drawing Sheets

(51) Int. Cl.
  *H10D 84/01* (2025.01)
  *H10D 84/03* (2025.01)
  *H10D 84/83* (2025.01)

(52) U.S. Cl.
  CPC ....... *H10D 62/292* (2025.01); *H10D 84/0128* (2025.01); *H10D 84/0151* (2025.01); *H10D 84/0158* (2025.01); *H10D 84/038* (2025.01); *H10D 84/834* (2025.01)

(58) Field of Classification Search
  CPC .. H10D 84/0151; H10D 84/02; H10D 84/032; H10D 84/035; H10D 84/05; H10D 84/07; H10D 84/08; H10D 84/0158; H10D 84/038; H10D 84/8311; H10D 84/8312; H10D 84/83125; H10D 84/83135; H10D 84/8314; H10D 84/8316; H10D 84/832–833; H10D 84/834; H10D 84/835; H10D 84/836; H10D 84/837–839
  See application file for complete search history.

SEMICONDUCTOR STRUCTURE AND FORMING METHOD THEREOF

The present application is a continuation application of PCT Patent Application No. PCT/CN2020/117828, filed on Oct. 16, 2020, the entire content of which is incorporated herein by reference.

TECHNICAL FIELD

Embodiments of the present disclosure relates to the field of semiconductor manufacturing, and in particular, to a semiconductor structure and a forming method thereof.

BACKGROUND

In semiconductor manufacturing, with the development trend of very large scale integration circuits, a characteristic size of integrated circuits has been continuously reduced. To adapt to the smaller characteristic size, a channel length of a metal-oxide-semiconductor field-effect transistor (MOSFET) is accordingly shortened. However, with the shortening of the channel length of the device, a distance between a source and a drain of the device is also shortened, such that a control ability of a gate structure on the channel becomes worse, and it is more and more difficult for a voltage of the gate structure to pinch off the channel. This causes a subthreshold leakage phenomenon, that is, so-called short-channel effects (SCEs) are more likely to occur.

Therefore, to reduce the influence of the short-channel effects, a semiconductor process gradually begins to transition from a planar MOSFET to a more efficient three-dimensional transistor, such as a fin type field-effect transistor (FinFET). In the FinFET, the gate structure can at least control an ultra-thin body (fin) from both sides, and the gate structure has a stronger channel control ability than the planar MOSFET and can well suppress the short-channel effects; and compared with other devices, the FinFET has better compatibility with existing integrated circuit manufacturing.

In the field of semiconductors, according to process requirements, it is usually necessary to form fins with different spacing, or to remove dummy fins where they are not needed, so that a pattern layer of the fin meets design requirements. At present, one method is to achieve the above purposes through fin cut process. The fin cut process generally includes a fin cut first process and a fin cut last process.

SUMMARY

Technical Problems

A problem addressed by embodiments and implementations of the present disclosure is to provide a semiconductor structure and a forming method thereof, which is beneficial to enlarge process windows for etching initial pattern layers in cutting areas to form target pattern layers.

Solutions

To address the above problem, an embodiment of the present disclosure provides a semiconductor structure forming method, including: providing a base, including a target layer, where the base includes target areas for forming target pattern layers and cutting areas corresponding to cutting positions; forming discrete mask spacers on the base; patterning the target layer using the mask spacers as masks, to form discrete initial pattern layers, where the initial pattern layers extend along a lateral direction, a direction perpendicular to the lateral direction is a longitudinal direction, and grooves are formed between the longitudinally adjacent initial pattern layers; forming boundary defining grooves that penetrate through the initial pattern layers located at boundary positions of the target areas and the cutting areas along the lateral direction; forming spacing layers filled into the grooves and the boundary defining grooves; and using the spacing layers located in the boundary defining grooves and the spacing layers located in the grooves as stop layers along the lateral direction and the longitudinal direction respectively, etching the initial pattern layers located in the cutting areas, and using the remaining initial pattern layers located in the target areas as the target pattern layers.

Accordingly, some implementations of the present disclosure further provides a semiconductor structure, including: a base, including target areas and cutting areas, where the base includes discrete target pattern layers in the target areas, the target pattern layers extend along the lateral direction, and a direction perpendicular to the lateral direction is the longitudinal direction; cutting grooves, located on the base in the cutting areas, where the cutting grooves extend along the lateral direction, and the cutting grooves are connected to the target pattern layers along the lateral direction, or the cutting grooves and the target pattern layers are arranged in parallel at intervals; boundary defining grooves, located between the cutting grooves and the target pattern layers along the lateral direction; and spacing layers, filled between the adjacent target pattern layers, between side walls of the adjacent cutting grooves, and between the side walls of the cutting grooves and the target pattern layers, where the spacing layers are filled into the boundary defining grooves.

Beneficial Effects

Compared with the prior art, technical solutions of the embodiments and implementations of the present disclosure have at least the following advantages: in the semiconductor structure forming method provided by embodiments of the present disclosure, after the initial pattern layers are formed, the boundary defining grooves that penetrate through the initial pattern layers located at the boundary positions of the target areas and the cutting areas are formed, and the boundary defining grooves are used for defining boundaries of the target areas, so that the initial pattern layers are disconnected at the boundary positions of the target areas and the cutting areas along the lateral direction, then the spacing layers filled into the grooves and the boundary defining grooves are formed, and therefore, the initial pattern layers are separated by the spacing layers at the boundary positions of the target areas and the cutting areas the along the lateral direction, and the longitudinally adjacent initial pattern layers are also separated by the spacing layers; in the process of etching the initial pattern layers located in the cutting areas, the spacing layers can define etching stop positions along the lateral direction and the longitudinal direction, so that the spacing layers located in the boundary defining grooves and the spacing layers located in the grooves can be correspondingly used as the stop layers along the lateral direction and the longitudinal direction. According to embodiments and implementations of the present disclosure, self-aligned etching along the lateral direction and the longitudinal direction can be realized, which is thus beneficial to enlarge the process windows for etching the initial pattern layers in the cutting areas and reduce the process difficulty of forming the target pattern layers, and can accurately control critical dimensions and patterns of the target pattern layers, thereby improving the cross-section profile quality and the side wall profile quality of the target pattern layers.

In an alternative solution, the target areas are active areas, and the cutting areas are isolation areas; the initial pattern layers are initial fins, and the target pattern layers are fins; the material of the spacing layers is a dielectric material; in the step of etching the initial pattern layers located in the cutting areas, cutting grooves are formed in the spacing layers; and after the initial pattern layers located in the cutting areas are etched, the forming method further includes: forming filling isolation layers in the cutting grooves; planarizing the filling isolation layers and the spacing layers using tops of the fins as stop positions; and removing part of the thickness of the filling isolation layers and the spacing layers, to expose part of side walls of the fins, and using the remaining filling isolation layers and the remaining spacing layers as isolation structures. According to embodiments and implementations of the present disclosure, the fin cut process can be integrated with the process for forming the isolation structures, which is beneficial to improve process integration and process compatibility, and is also beneficial to simplify a process flow and improve production efficiency.

DETAILED DESCRIPTION

It can be known from the background that fins with different spacing are formed by a fin cut process, or dummy fins at unnecessary positions are removed, to make the pattern of the fins meet design requirements. The fin cut process generally includes a fin cut first process and a fin cut last process.

However, at present, a process window of the fin cut process is getting smaller and smaller, and the difficulty of the fin cut process is getting higher and higher.

Taking the fin cut first process as an example, the reasons why the process window of the fin cut process is getting smaller and smaller are analyzed. Referring to FIG. 1 to FIG. 4, schematic structural diagrams corresponding to steps in a semiconductor structure forming method are shown.

Figure 1:
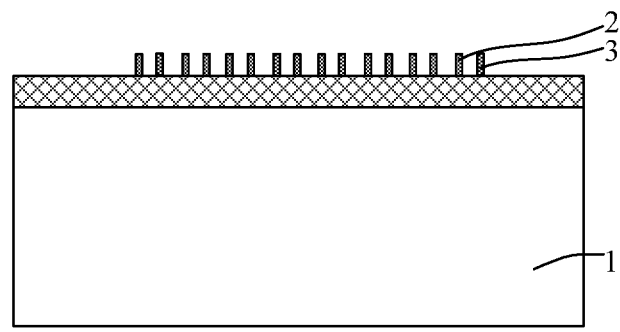
FIG. 1 to FIG. 4 are schematic structural diagrams corresponding to steps in a semiconductor structure forming method.

Referring to FIG. 1, a base 1 is provided; a plurality of discrete spacers is formed on the base 1, where the spacers include mask spacers 2 and dummy mask spacers 3.

Figure 2:
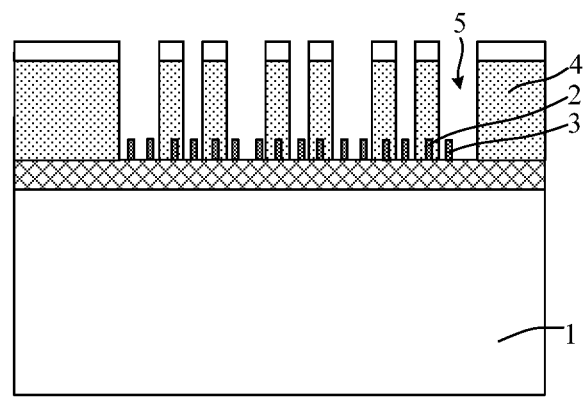
Figure 3:
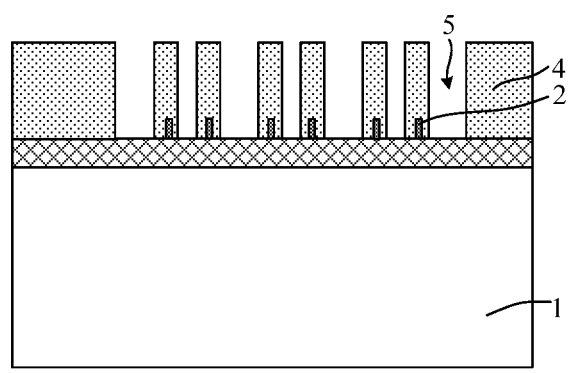

Referring to FIG. 2 to FIG. 3, the dummy mask spacers 3 are removed. The step of removing the dummy mask spacers 3 includes: a mask layer 4 is formed on the base 1, the mask layer has mask openings 5 exposing the dummy mask spacers 3; the dummy mask spacers 3 exposed by the mask openings 5 are removed using the mask layer 4 as a mask; and the mask layer 4 is removed.

Figure 4:
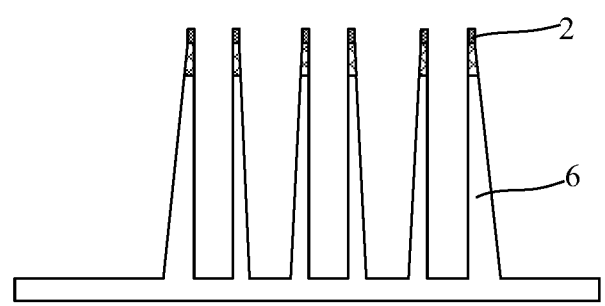

Referring to FIG. 4, after the dummy mask spacers 3 are removed, the base 1 is patterned using the mask spacers 2 as masks to form fins 6.

A height-to-width ratio of the dummy mask spacers 3 is smaller than that of the fins 6, and thus the difficulty of removing the dummy mask spacers 3 is relatively low. However, according to implementations of the above-described method, the dummy mask spacers 3 are removed at first; after the dummy mask spacers 3 are removed, the mask spacers 2 have different spacing, pattern densities of the mask spacers 2 are non-uniform; in the process of patterning the base 1 using the mask spacers 2 as the masks, the non-uniform pattern densities of the mask spacers 2 easily lead to non-uniform rates for etching the base 1 in the areas, thereby leading to poor cross-section profile uniformity of the formed fins.

Another method is the fin cut last process. FIG. 5 to FIG. 8 are schematic structural diagrams corresponding to steps in another semiconductor structure forming method.

Figure 5:
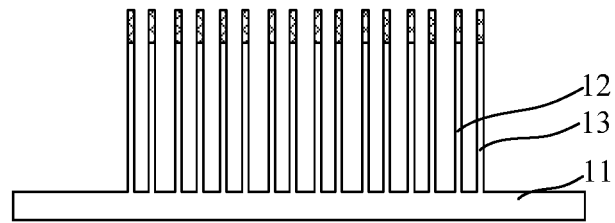
FIG. 5 to FIG. 8 are schematic structural diagrams corresponding to steps in another semiconductor structure forming method.
Figure 6:
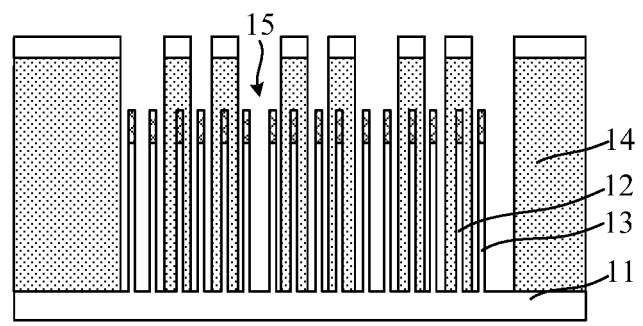
Figure 7:
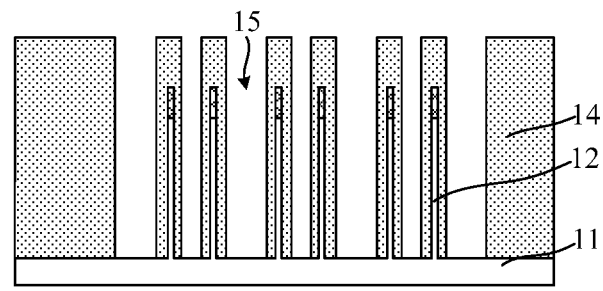
Figure 8:
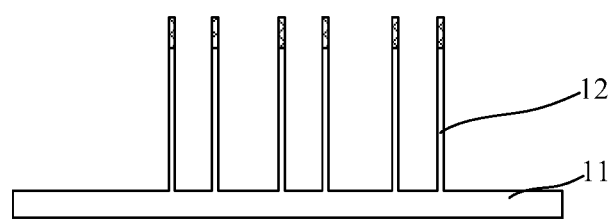

Referring to FIG. 5, a substrate 11 and discrete fins on the substrate 11 are provided, where the fins include device fins 12 and dummy fins 13.

Referring to FIG. 5 to FIG. 8, the dummy fins 13 are removed. The step of removing the dummy fins 13 includes: a mask layer 14 covering the device fins 12 is formed on the substrate 11, the mask layer 14 is formed with mask openings 15 exposing the dummy fins 13; the dummy fins 13 exposed by the mask openings 15 are removed using the mask layer 14 as a mask; and the mask layer 14 is removed.

According to implementations of the above-described method, after the fins are formed, the dummy fins 13 are further removed; the fins are formed by patterning the base using the mask spacers as the masks; since the mask spacers have the same spacing therebetween, pattern densities of the mask spacers are highly consistent, so that dimension consistence and cross-section profile consistence of the fins are relatively high in the step of patterning the base to form the fins.

However, a height-to-width ratio of the fins is relatively greater than that of the mask spacers, leading to great challenges in removal of the dummy fins 13. Specifically, the mask layer 14 is generally formed by photolithography processes such as exposure and development. The height-to-width ratio of the dummy fins 13 is relatively large, and a depth-to-width ratio of the mask openings 15 is also relatively large, leading to reduction of a process window of a photolithography process for forming the mask layer 14. The height-to-width ratio of the dummy fins 13 is relatively large, and an etching height-to-width ratio of the etching process is relatively large in the process of removing the dummy fins 13 exposed by the mask openings 15, leading to relatively high difficulty of the etching process.

Figure 9:
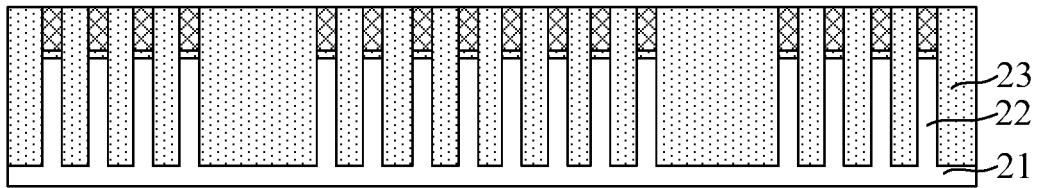
FIG. 9 and FIG. 10 are schematic structural diagrams corresponding to steps in yet another semiconductor structure forming method.
Figure 10:
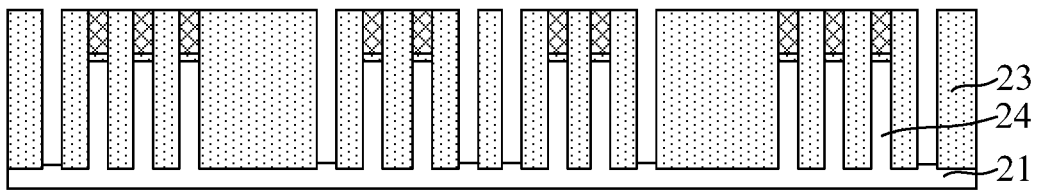

There are some other methods to carry out the fin cut process. Referring to FIG. 9 to FIG. 10, schematic structural diagrams corresponding to steps in yet another semiconductor structure forming method are shown.

Referring to FIG. 9, a substrate 21 and discrete initial fins 22 on the substrate 21 are provided, where the substrate 21 includes active areas (not shown) and isolation areas (not shown); and covering layers 23 filled between the initial fins 22 are formed on the substrate 21.

Referring to FIG. 10, after the covering layers 23 are formed, the initial fins 22 located in the isolation areas are removed, and the remaining initial fins 22 located in the active areas are used as fins 24.

By forming the covering layers 23, in the process of removing the initial fins 22 located in the isolation areas, the covering layers 23 can define stop positions along a direction perpendicular to the extension direction of the initial fins 22. However, in the extension direction of the initial fins 22, since etching objects are of a same material, it is difficult to control etching stop positions, and thus it is difficult to control the residual amount of the initial fins 22, which not only leads to low cross-section profile quality and side wall perpendicularity of the formed fins 24, but also easily leads to the failure of critical dimensions (CDs) of the fins 24 to meet design requirements, and a process window of the fin cut process is relatively small.

Therefore, there is an urgent need for a method that can enlarge the process window of a fin patterning process and reduce the difficulty of a fin patterning process.

To address the technical problems, in the semiconductor structure forming method provided by an embodiment of the present disclosure, after initial pattern layers are formed, boundary defining grooves that penetrate through the initial pattern layers located at boundary positions of target areas and cutting areas along the lateral direction are formed, and the boundary defining grooves are used for defining boundaries of the target areas, so that the initial pattern layers are disconnected at the boundary positions of the target areas and the cutting areas along the lateral direction, then spacing layers filled into grooves and the boundary defining grooves are formed, and therefore, the initial pattern layers are separated by the spacing layers at the boundary positions of the target areas and the cutting areas along the lateral direction, and the longitudinally adjacent initial pattern layers are also separated by the spacing layers. In the process of etching the initial pattern layers located in the cutting areas, the spacing layers can define etching stop positions along the lateral direction and the longitudinal direction, so that the spacing layers in the boundary defining grooves and the spacing layers in the grooves can be correspondingly used as stop layers along the lateral direction and the longitudinal direction. According to embodiments and implementations of the present disclosure, self-aligned etching along the lateral direction and the longitudinal direction can be realized, which is thus beneficial to enlarge process windows for the initial pattern layers in the cutting areas and reduce the process difficulty of forming the target pattern layers, and can accurately control critical dimensions and patterns of the target pattern layers, thereby improving the cross-section profile quality and the side wall profile quality of the target pattern layers.

To make the above objectives, features, and advantages of embodiments and implementations of the present disclosure more apparent and easier to understand, specific embodiments and implementations of the present disclosure are described in detail below with reference to the accompanying drawings. FIG. 11 to FIG. 28 are schematic structural diagrams corresponding to steps in an embodiment of a semiconductor structure forming method according to the present disclosure.

Figure 11:
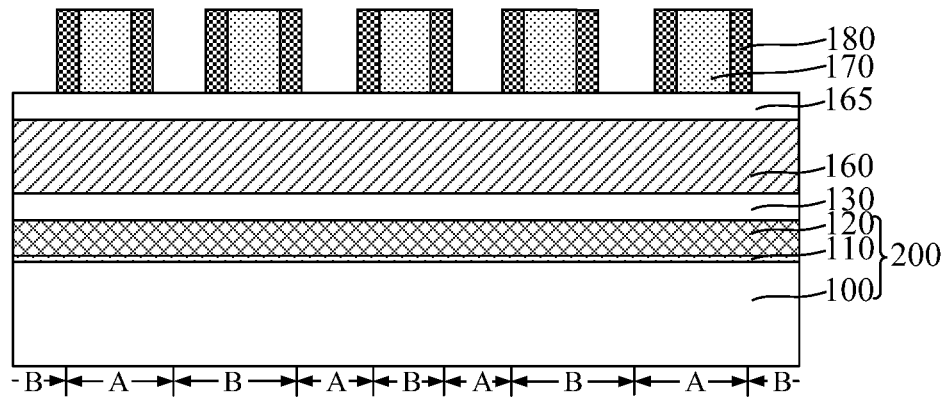
FIG. 11 to FIG. 28 are schematic structural diagrams corresponding to steps in an embodiment of a semiconductor structure forming method according to the present disclosure.

Referring to FIG. 11, a schematic diagram of a cross-section is shown. A base 200 is provided, where the base includes a target layer 100, and the base 200 includes target areas A for forming target pattern layers and cutting areas B corresponding to cutting positions.

The base 200 provides a technical platform for subsequent technical processes. The target layer 100 is a membrane layer to be patterned to form the target pattern layers. The target areas A are areas where the target pattern layers are located subsequently, and the areas on the base 200 other than the target areas A are the cutting area B.

In some implementations, the target layer 100 is an initial substrate, and the initial substrate is subsequently patterned to form a substrate and fins protruding from the substrate. Accordingly, in some implementations, the target pattern layers are the fins. The fins are used for forming fin type field-effect transistors (FinFETs). Accordingly, in some implementations, the target areas A are active areas (AA), and the cutting areas B are isolation areas.

In some implementations, the material of the initial substrate is silicon. In other implementations, the material of the initial substrate may alternatively be germanium, silicon germanium, silicon carbide, gallium arsenide or indium gallium or other material, and the initial substrate may alternatively be a silicon substrate on an insulator or a germanium substrate on an insulator or other types of substrate.

In other implementations, the target pattern layers may alternatively be pattern layers such as gate structures, channel stack layers in gate-all-around (GAA) transistors, pattern transferring layers or dielectric spacing layers. The pattern transferring layers may be membrane layers such as hard mask layers, and the dielectric spacing layers may be dielectric layers used for isolating back section metal interconnection line.

In some implementations, the base 200 further includes a hard mask material layer 120 located on the target layer 100. Subsequently, the hard mask material layer 120 is first patterned using mask spacers as masks to form hard mask layers, even if the mask spacers are worn in the process of patterning the target layer 100, the target layer 100 can be continuously patterned using the hard mask layers as the masks, which is beneficial to improve process stability of patterning the target layer 100 and pattern transferring precision. Furthermore, subsequent processes include multiple etching processes, and the hard mask material layer 120 can also define etching stop positions in these etching processes, so as to avoid etching damage to the membrane layers below. The material of the hard mask material layer 120 includes at least one of silicon nitride, titanium nitride, tungsten carbide, silicon oxide, silicon oxycarbide or silicon oxy-carbonitride. In some implementations, the material of the hard mask material layer 120 is silicon nitride.

In some implementations, the base 200 further includes an adhesive layer 110 located between the target layer 100 and the hard mask material layer 120. The adhesive layer 110 is used for improving adhesion between the hard mask material layer 120 and the target layer 100, and reducing a stress generated between the membrane layers. In some implementations, the material of the adhesive layer 110 is silicon oxide.

Figure 15:
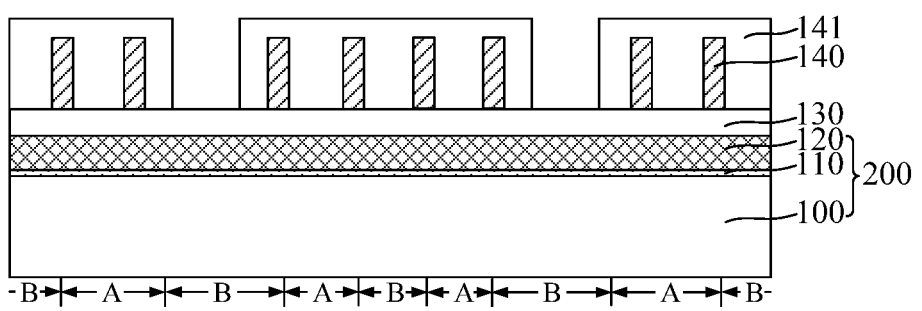
Figure 16:
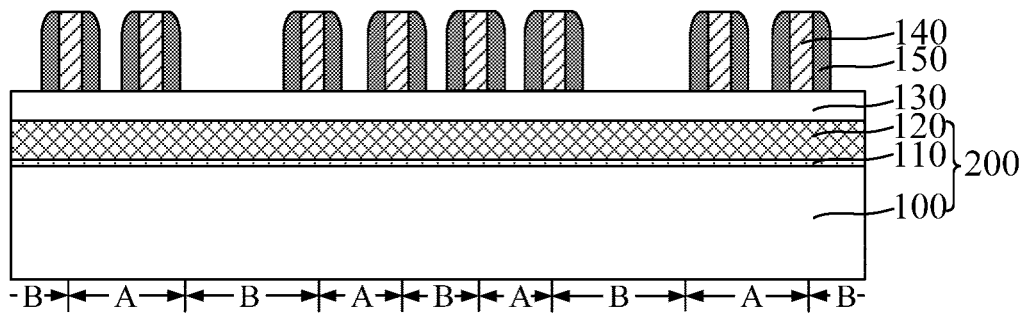
Figure 17:
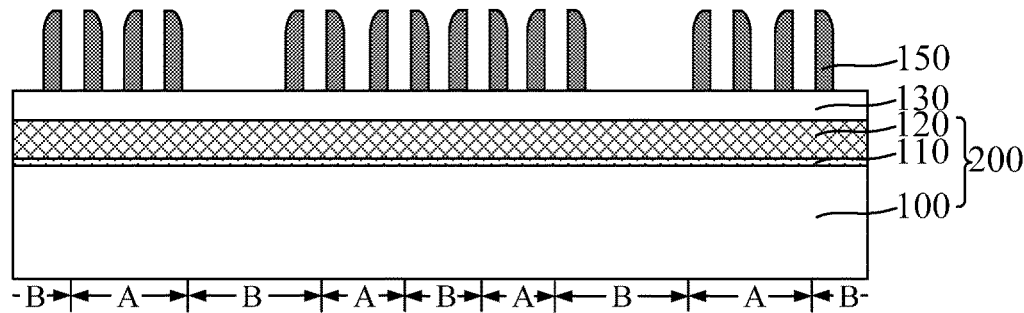

Referring to FIG. 11 to FIG. 17, discrete mask spacers 150 are formed on the base 200 (as shown in FIG. 17). The mask spacers 150 are used as masks for patterning the target layer 100.

The mask spacers 150 select a material with etching selectivity to the target layer 100, thereby ensuring that the mask spacers 150 can be used as masks for patterning the target layer 100. The material of the mask spacers 150 includes silicon oxide, silicon nitride, silicon oxynitride, silicon, aluminum oxide, titanium nitride or titanium oxide, nitrogen doped tungsten or tungsten doped carbon or other material. In some implementations, the mask spacers 150 may be formed by SADP process or SAQP process. Specifically, in some implementations, taking formation of the mask spacers 150 by the SAQP process as an example, the steps of forming the mask spacers 150 are described in detail.

Figure 12:
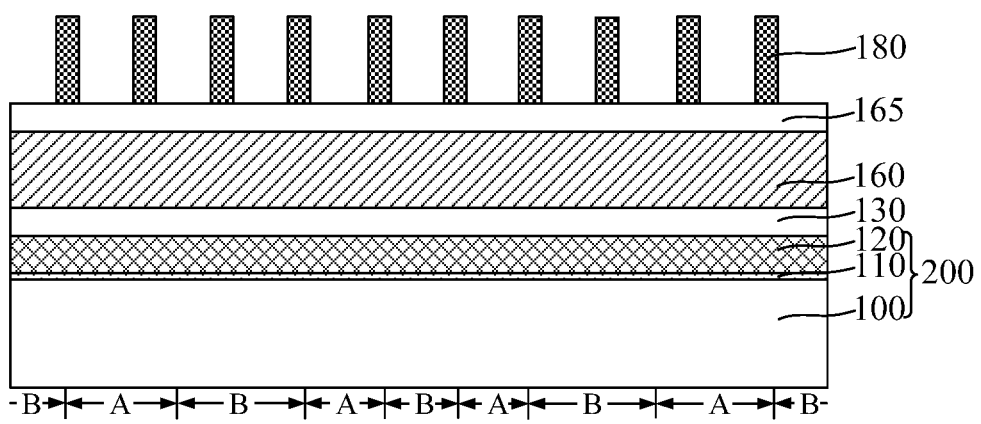
Figure 13:
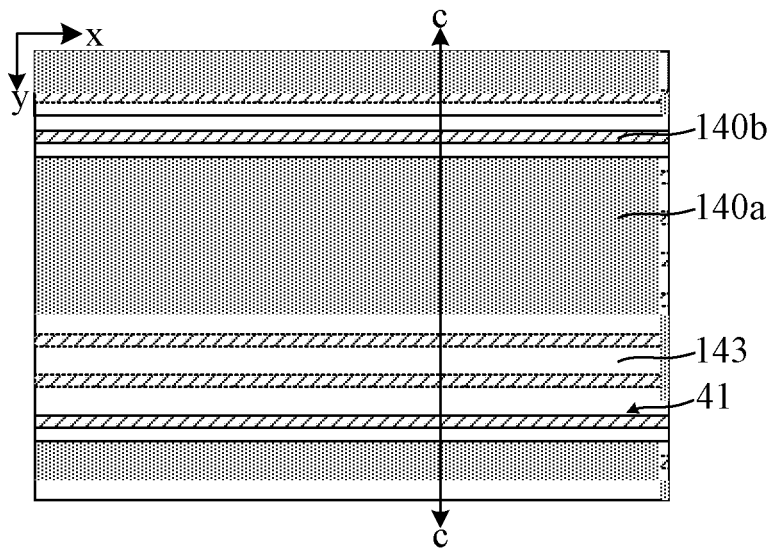
Figure 14:
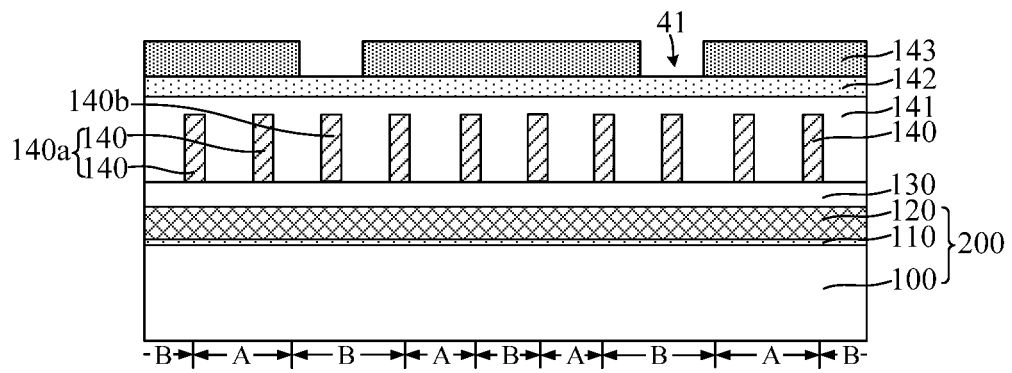

As shown in FIG. 11 to FIG. 14, discrete core layers 140 are formed on the base 200 (as shown in FIG. 14).

The core layers 140 are used for providing support for formation of the mask spacers. In some implementations, the plurality of adjacent core layers 140 form a support core layer 140a, and single core layer 140 forms a sacrificial core layer 140b.

In some implementations, the step of forming the core layers 140 includes: as shown in FIG. 11, a core material layer 160 is formed on the base 200, discrete sacrificial layers 170 are formed on the core material layer 160; initial spacers 180 are formed on side walls of the sacrificial layers 170; as shown in FIG. 12, the sacrificial layers 170 are removed; and as shown in FIG. 13 and FIG. 14, the core material layer 160 is patterned using the initial spacers 180 as masks, to the form core layers 140.

In some implementations, after the base 200 is provided and before the core material layer 160 is formed, the forming method further includes: a first etching stop layer 130 is formed on the base 200. The first etching stop layer 130 is used for defining an etching stop position for a subsequent etching process, so as to avoid the problem of etching inconsistency.

In some implementations, after the core material layer 160 is formed and before the sacrificial layers 170 are formed, the forming method further includes: a second etching stop layer 165 is formed on the core material layer 160. The processes for forming the sacrificial layers 170 and the initial spacers 180 include a process combining deposition and etching. The second etching stop layer 165 is used for defining an etching stop position in the etching process for forming the sacrificial layers 170 and the initial spacers 180, to avoid damage to the core material layer 160 below and to avoid the problem of etching inconsistency. Furthermore, in the process of patterning the core material layer 160 using the initial spacers 180 as the masks, the second etching stop layer 165 can be first patterned using the initial spacers 180 as the masks, and the patterned second etching stop layer 165 can also be used as the mask for patterning the core material layer 160, which is beneficial to improve process stability and precision of pattern transferring.

In some implementations, the core layers 140 extend along the lateral direction (as shown in the x direction in FIG. 13), and are arranged at intervals along the longitudinal direction (as shown in y direction in FIG. 13), the lateral direction is perpendicular to the longitudinal direction. In some implementations, after the core material layer 160 is patterned to form the core layers 140, the forming method further includes: the initial spacers 180 and the second etching stop layer 165 are removed.

As shown in FIG. 16, mask spacers 150 are formed on side walls of the core layers 140.

In some implementations, the step of forming the mask spacers 150 includes: spacer membranes (not shown in the figure) conformally covering top surfaces and the side walls of the core layers 140 and a top surface of the base 200 are formed; the spacer membranes located on the top surfaces of the core layers 140 and the top surface of the base 200 are removed, and the remaining spacer membranes located on the side walls of the core layers 140 are used as the mask spacers 150.

As shown in FIG. 17, the forming method further includes: after the mask spacers 150 are formed, the core layers 140 are removed to expose the base 200 below, so as to prepare for patterning the base 200 using the mask spacers 150 as masks.

Referring to FIG. 13 to FIG. 15, FIG. 13 is a top view, FIG. 14 is a diagram of a cross-section at a position cc in FIG. 13, and FIG. 15 is a diagram of a cross-section based on FIG. 14, in some implementations, the forming method further includes: after the core layers 140 are formed and before the mask spacers 150 are formed, the sacrificial core layers 140b located in the cutting areas B are removed.

The subsequent process for etching the initial pattern layers located in the cutting areas B needs to form etching masks for etching the initial pattern layers located in the cutting areas B. Removing the sacrificial core layers 140b located in the cutting areas B is beneficial to reduce pattern complexity of the etching masks, thereby enlarging process windows for forming the etching masks (for example: alleviating the limitations of photolithography resolution). Furthermore, each sacrificial core layer 140b is formed by the single core layer 140, removing the sacrificial core layers 140b located in the cutting areas B has little influence on the spacing between the remaining core layers 140, and when forming the mask spacers, the influence on spacing consistency between the mask spacers is small, which is beneficial to alleviate the problem of different etching rates caused by different pattern densities in the process of patterning the target layer 100 using the mask spacers as the masks, and accordingly is beneficial to ensure that critical dimensions, cross-section profiles and side wall perpendicularity of the initial pattern layers can meet design requirements. In addition, a height-to-width ratio of the core layers 140 is relatively small, and it is less difficult to remove the single core layer 140.

In some implementations, the step of removing the sacrificial core layers 140b located in the cutting area B includes: as shown in FIG. 13 and FIG. 14, a first pattern layer 143 is formed on the core layers 140, the first pattern layer 143 has first openings 41 formed above the sacrificial core layers 140b located in the cutting areas B; as shown in FIG. 15, the sacrificial core layers 140b are etched along the first openings 41 using the first pattern layer 143 as a mask; and the first pattern layer 143 is removed.

In some implementations, the first pattern layer 143 is a photoresist layer. In some implementations, before the first pattern layer 143 is formed, a first flat layer 141 covering the core layers 140, and a first anti-reflective layer 142 located on the first flat layer 141 are further formed on the base 200. It should be noted that for ease of illustration and description, some implementations only illustrate the first flat layer 141 and the first anti-reflective layer 142 in FIG. 14.

In other implementations, in the step of forming the mask spacers, the sacrificial core layers and the mask spacers located on side walls of the sacrificial core layers form sacrificial pattern layers; and after the mask spacers are formed and before the target layer is patterned, the sacrificial pattern layers located in the cutting areas are removed. Specifically, removing the sacrificial pattern layers located in the cutting areas may include: after the mask spacers are formed and before the core layers are removed, the sacrificial pattern layers located in the cutting areas are removed.

In the process of removing the sacrificial pattern layers located in the cutting areas, pattern layers used as etching masks need to be formed; the pattern layers are formed by a photolithography process; the photolithography process usually needs a calibration process; after the mask spacers are formed, two kinds of membrane layers are formed on the base: core layers and mask spacers. After the mask spacers are formed and before the core layers are removed, removing the sacrificial pattern layers located in the cutting areas is beneficial to improve contrast of patterns on the base, thereby providing more accurate alignment marks for calibration of the photolithography process, and accordingly is beneficial to improve the calibration clarity and precision of the photolithography process.

In some other implementations, removing the sacrificial pattern layers located in the cutting areas may further include: after the core layers are removed and before the target layer is patterned, the mask spacers located in the sacrificial pattern layers in the cutting areas are removed.

Figure 18:
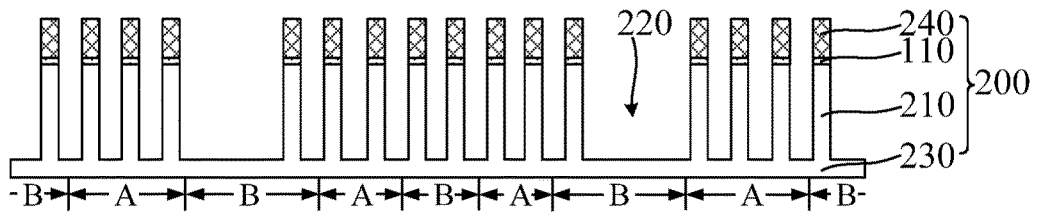

Referring to FIG. 18, the target layer 100 is patterned using the mask spacers 150 as masks, to form discrete initial pattern layers 210. The initial pattern layers 210 extend along the lateral direction (as shown in the x direction in FIG. 13), a direction perpendicular to the lateral direction is the longitudinal direction (as shown in the y direction in FIG. 13), and grooves 220 are formed between the adjacent initial pattern layers 210 along the longitudinal direction. The initial pattern layers 210 are used for forming target pattern layers via a subsequent cut process.

In some implementations, the target pattern layers are fins, and accordingly the initial pattern layers 210 are initial fins.

In some implementations, the target layer 100 is patterned to form a substrate 230 and the discrete initial fins on the substrate 230. The grooves 220 are enclosed by the adjacent initial fins and the substrate 230.

In some implementations, after the mask spacers 150 are formed and before the target layer 100 is patterned, the forming method further includes: the hard mask material layer 120 is patterned using the mask spacers 150 as masks, to form hard mask layers 240.

The hard mask layers 240 can protect the initial pattern layers 210 in a subsequent process. Specifically, the subsequent process further includes the process of filling spacing layers into the grooves 220, where formation of the spacing layers includes performing a planarization process. The hard mask layers 240 can be used for defining stop positions for the planarization process. Furthermore, in the subsequent process of etching the initial pattern layers 210 located in the cutting areas B, the hard mask layers 240 located in the cutting areas are further removed to expose tops of the initial pattern layers 210 in the cutting areas B. Accordingly, in the step of etching the initial pattern layers 210 located in the cutting areas B, the spacing layers and the remaining hard mask layers 240 can be used as the masks for the initial pattern layers 210 in the cutting areas B, thereby playing a role in protecting the initial pattern layers 210 located in the target areas A, and reducing the probability of misetching the initial pattern layers 210 in the target areas A.

Figure 19:
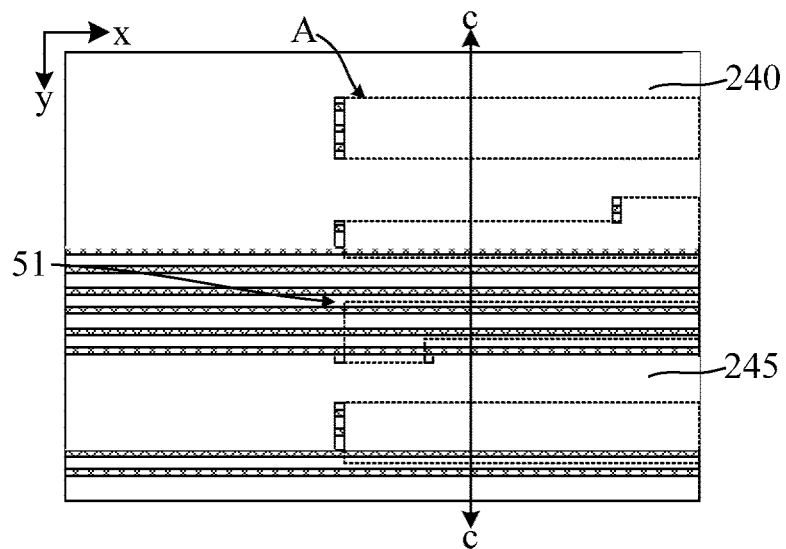
Figure 20:
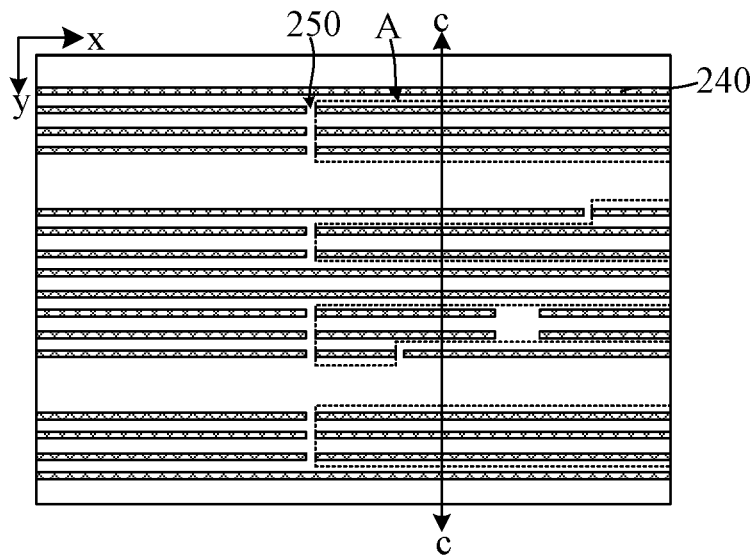

Referring to FIG. 19 to FIG. 20, top views are shown. Boundary defining grooves 250 that penetrate through the initial pattern layers 210 located at boundary positions of the target areas A and the cutting areas B along the lateral direction are formed.

The boundary defining grooves 250 are used for defining boundaries of the target areas A, so that the initial pattern layers 210 are disconnected at the boundary positions of the target areas A and the cutting areas B along the lateral direction, the spacing layers filled into the grooves 220 and the boundary defining grooves 250 are then formed, and therefore, the initial pattern layers 210 are separated by the spacing layers at the boundary positions of the target areas A and the cutting areas B along the lateral direction, and the longitudinally adjacent initial pattern layers 210 are also separated by the spacing layers. In the process of etching the initial pattern layers 210 located in the cutting areas B, the spacing layers can define etching stop positions along the lateral direction and the longitudinal direction, which is beneficial to enlarge process windows for forming the target pattern layers and reduce the process difficulty of forming the target pattern layers, and can accurately control critical dimensions and patterns of the target pattern layers, thereby improving the cross-section profile quality and the side wall profile quality of the target pattern layers.

In some implementations, the boundary defining grooves 250 further penetrate through the hard mask layers 240 located at the boundary positions of the target areas A and the cutting areas B along the lateral direction. Opening widths of the boundary defining grooves 250 along the lateral direction are inadvisable to be too small, otherwise it is easy to increase the process difficulty of etching the initial pattern layers 210 to form the boundary defining grooves 250, and it is also difficult to control the side wall perpendicularity of the remaining initial pattern layers 210 in the target areas A; the opening widths of the boundary defining grooves 250 along the lateral direction are also inadvisable to be too large, otherwise it is easy to cause inconsistent etching rates of the initial pattern layers 210 of different types of patterns, and thus it is difficult to perform accurate control on the remaining initial pattern layers 210 in the target areas A. Therefore, in the actual process, it is necessary to properly set the opening widths of the boundary defining grooves 250 according to actual process requirements.

In some implementations, the step of forming the boundary defining grooves 250 includes: as shown in FIG. 19, boundary defining mask layers 245 covering the initial pattern layers 210 are formed, the boundary defining mask layers 245 are formed with boundary defining openings 51 located at the boundary positions of the target areas A and the cutting areas B; as shown in FIG. 20, the initial pattern layers 210 are etched along the boundary defining openings 51 using the boundary defining mask layers 245 as masks, to form boundary defining grooves 250; and the boundary defining mask layers 245 are removed.

In some implementations, the boundary defining mask layers 245 are located on the hard mask layers 240. Therefore, the hard mask layers 240 are exposed from the boundary defining openings 51. Accordingly, the hard mask layers 240 and the initial pattern layers 210 are sequentially etched along the boundary defining openings 51. In some implementations, boundaries of the boundary defining openings 51 may be located between the initial pattern layers 210 along the longitudinal direction.

In some implementations, processes for etching the initial pattern layers 210 include an anisotropic dry etching process along the boundary defining openings 51. The anisotropic dry etching process has anisotropic etching characteristics, which is beneficial to improve cross-section controllability of etching and etching precision, and accordingly is beneficial to preform accurate control on the cross-section profile, the side wall perpendicularity and the opening widths of the boundary defining openings 51.

In some implementations, for ease of illustration and description, the shapes and positions of the target areas A are illustrated with dashed boxes in FIG. 19 and FIG. 20. The areas other than the target areas A are the cutting areas B.

Figure 21:
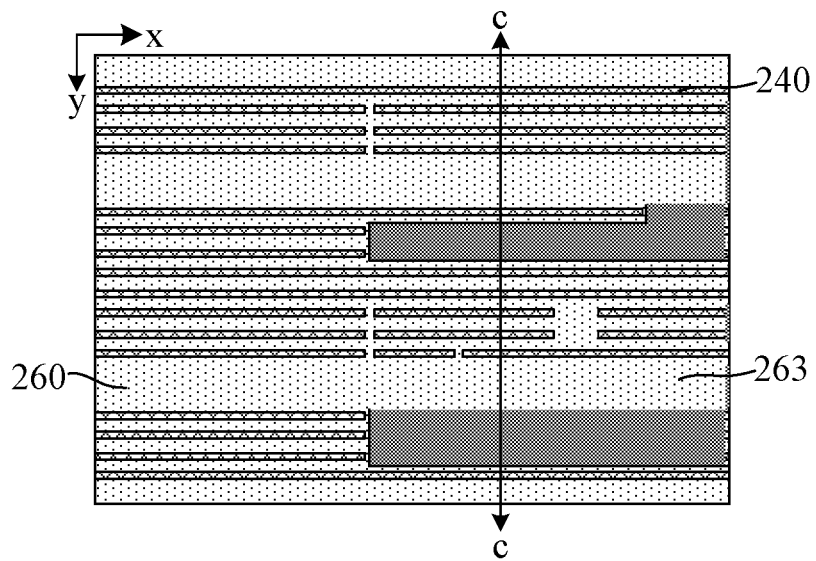

Referring to FIG. 21, spacing layers 260 filled into the grooves 220 and the boundary defining grooves 250 are formed.

The spacing layers 260 are filled into the grooves 220 and the boundary defining grooves 250, so that the initial pattern layers 210 are separated by the spacing layers 260 at the boundary positions of the target areas A and the cutting areas B along the lateral direction, and the longitudinally adjacent initial pattern layers 210 are also separated by the spacing layers 260. In the process of etching the initial pattern layers 210 located in the cutting areas B, the spacing layers 260 can define etching stop positions along the lateral direction and the longitudinal direction.

In some implementations, the spacing layers 260 cover side walls of the hard mask layers 240.

In some implementations, the material of the spacing layers 260 is a dielectric material. In some implementations, the target pattern layers are fins, and the dielectric material is used as the material of the spacing layers 260, so that after the initial fins located in the cutting areas B are subsequently etched, planarization and etching can be further performed on the spacing layers 260, and thus the remaining spacing layers 260 can be used for forming isolation structures, to isolate the adjacent fins. Therefore, formation of the spacing layers 260 can be integrated with the fin cut process and the process for forming the isolation structures, process integration and process compatibility are improved, a process flow can be simplified, and production efficiency can be improved. Specifically, the material of the spacing layers 260 includes at least one of silicon oxide, silicon oxynitride, silicon nitride, silicon carbide, silicon oxycarbide or silicon oxy-carbonitride. As an example, the material of the spacing layers 260 is silicon oxide.

In other implementations, the spacing layers can be removed subsequently, which is accordingly beneficial to improve the selection flexibility of the material of the spacing layers, for example: the material of the spacing layers may not be the dielectric material, and the material of the spacing layers may include spin-on carbon (SOC), amorphous carbon, organic dielectric layer (ODL), a silicon-anti-reflective coating (Si-ARC), deep UV light absorbing oxide (DUO), a dielectric anti-reflective coating (DARC) or an advanced patterning film (APF). The material of the spacing layers is easy to be removed, which is beneficial to reduce the difficulty of subsequent removal of the spacing layers.

In some implementations, the step of forming the spacing layers 260 includes: spacing material layers (not shown in the figure) filled into the grooves 220 and the boundary defining grooves 250 and covering the hard mask layers 240 are formed; and the spacing material layers is planarized using tops of the hard mask layers 240 as stop positions, and using the remaining spacing material layers as the spacing layers 260.

In some implementations, processes for forming the spacing material layers include at least one of a flowable chemical vapor deposition (FCVD) process, an atomic layer deposition (ALD) process or a spin-on process. The processes for forming the spacing material layers are processes with relatively high gap filling ability, which is beneficial to improve the ability of filling the spacing material layers into the grooves 220 and the boundary defining grooves 250, and accordingly improve the forming quality of the spacing material layers. As an example, the flowable chemical vapor deposition process is used for forming the spacing material layers.

In some implementations, processes for planarizing the spacing material layers include a chemical mechanical grinding process. The chemical mechanical grinding process is an overall planarization technology, which is beneficial to improve the flatness of top surfaces of the spacing layers 260, and is further beneficial to improve the efficiency of planarizing the spacing material layers.

Figure 22:
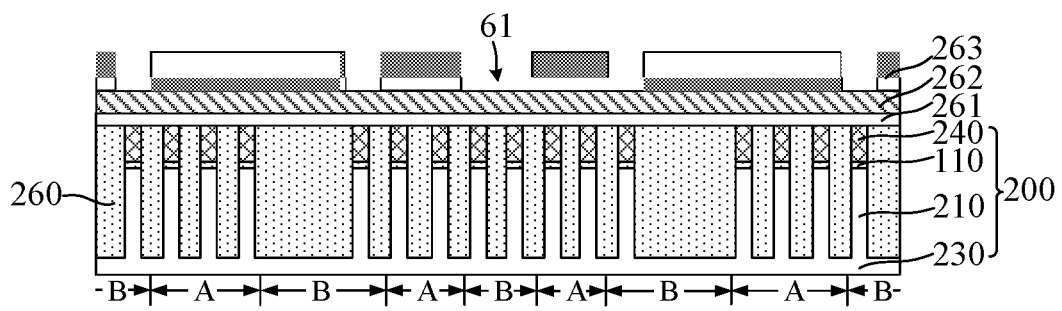
Figure 23:
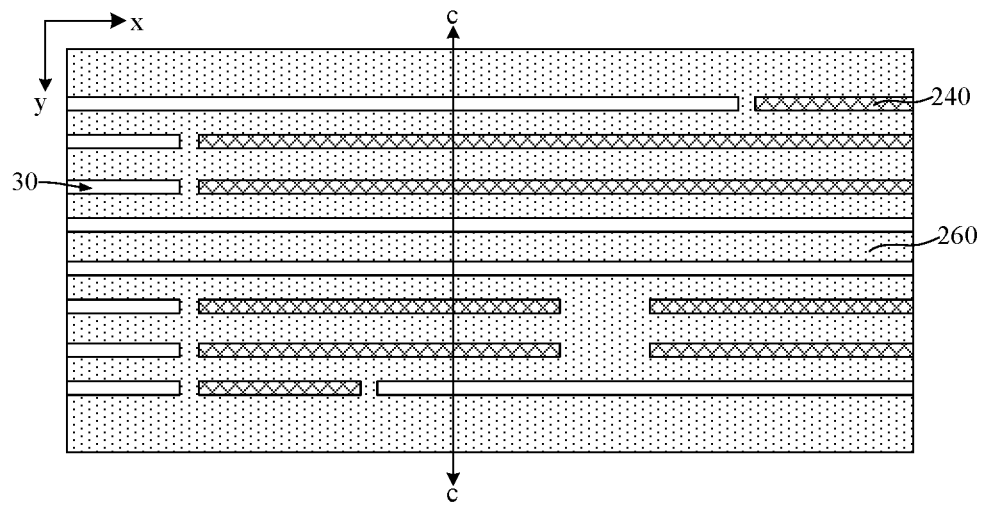
Figure 24:
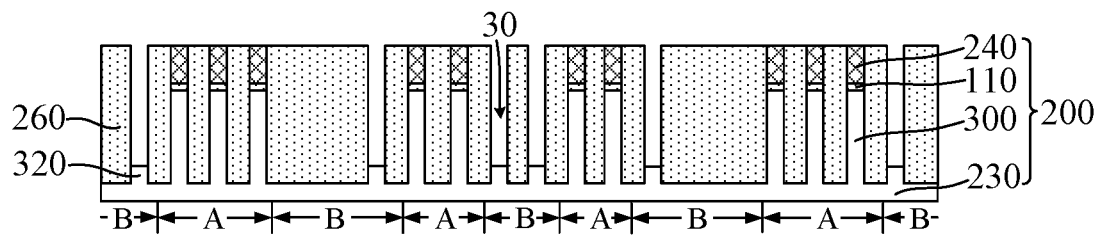

Referring to FIG. 21 to FIG. 24, the spacing layers 260 located in the boundary defining grooves 250 and the spacing layers 260 located in the grooves 220 as stop layers are used along the lateral direction and the longitudinal direction respectively, the initial pattern layers 210 located in the cutting areas B are etched, and the remaining initial pattern layers 210 located in the target areas A are used as target pattern layers 300 (as shown in FIG. 24). In some implementations, in the step of etching the initial pattern layers 210 located in the cutting areas B, cutting grooves 30 are formed in the spacing layers 260.

In some implementations, the spacing layers located in the boundary defining grooves 250 and the spacing layers 260 located in the grooves 220 can be used as the stop layers along the lateral direction and the longitudinal direction respectively, accordingly self-aligned etching along the lateral direction and the longitudinal direction can be realized, which thus enlarges process windows for etching the initial pattern layers 210 located in the cutting areas B, and reduces the process difficulty of forming the target pattern layers 300, and can accurately control critical dimensions and patterns of the target pattern layers 300, thereby improving the section profile quality and the side wall profile quality of the target pattern layers 300. In some implementations, the target pattern layers 300 are fins, the section profile quality and the side wall profile quality of the fins are relatively high, and the critical dimensions of the fins are accurately controlled, which is beneficial to improve the performance of FinFET devices.

In some implementations, the initial fins located in the cutting areas B are etched, to form residual dummy fins 320 located in the cutting areas B. By forming the residual dummy fins 320, in the subsequent process of forming isolation structures covering part of side walls of the fins on the substrate 230, the residual dummy fins 320 are located between the adjacent fins, which can play a role in dispersing a stress, thereby being beneficial to improve the probability that the fins are bent or tilted due to different stresses.

The height of the residual dummy fin 320 is inadvisable to be too small, otherwise it is easy to reduce the stress dispersion effect of the residual dummy fins 320; and the height of the residual dummy fin 320 is inadvisable to be too large, otherwise it is easy to lead to too small distances between top surfaces of the isolation structures and the residual dummy fins 320 after the isolation structures are formed subsequently, and it is easy to increase the risk of generating leakage current. Therefore, in some implementations, the height of the residual dummy fins 320 is less than or equal to 20% of the height of the fins. As an example, the height of the residual dummy fins 320 is less than or equal to 200 Å.

In some implementations, etching the initial pattern layers 210 located in the cutting areas B includes the steps as follows.

As shown in FIG. 21 and FIG. 22, FIG. 21 is a top view, and FIG. 22 is a diagram of a cross-section at a position cc in FIG. 21, second pattern layers 263 are formed on the spacing layers 260, and the second pattern layers 263 have second openings 61 formed in the cutting areas B. The second pattern layers 263 cover the initial pattern layers 210 in the target areas A, and the second pattern layers 263 have the second openings 61 located in the cutting areas B, which is used as masks for etching the initial pattern layers 210.

In some implementations, the second pattern layers 263 are photoresist layers, and the second pattern layers 263 are formed by photolithography processes such as exposure and development. In some implementations, since the longitudinally adjacent initial pattern layers 210 are separated by the spacing layers 260, and the initial pattern layers 210 along the lateral direction in the target areas A and the cutting areas B are separated by the spacing layers 260, therefore, edges of the second openings 61 along the longitudinal direction may be located between the two adjacent initial pattern layers 210, and edges of the second openings 61 along the lateral direction may be located on the spacing layers 260 in the boundary defining grooves 250, which is thus beneficial to increase overlay shift tolerance when forming the second openings 61, and is then beneficial to improve process windows for forming the second pattern layers 263. In some implementations, before the second pattern layers 263 are formed, the forming method further includes: a second flat layer 261 and a second anti-reflective layer 262 are formed on the spacing layers 260.

As shown in FIG. 23 and FIG. 24, FIG. 23 is a partial enlarged view on the basis of FIG. 21, and FIG. 24 is a diagram of a cross-section at a position cc in FIG. 23, the initial pattern layers 210 below the second openings 61 are etched using the second pattern layers 263 as masks. In some implementations, the spacing layers 260 can be used as stop layers both along the lateral direction and the longitudinal direction to define stop positions for etching the initial pattern layers 210 in the cutting areas B, thereby being beneficial to reduce the difficulty of etching the initial pattern layers 210, and improve the flexibility of process selection for etching the initial pattern layers 210, for example: the process for etching the initial pattern layers 210 has a relatively high etching selection ratio between the initial pattern layers 210 and the spacing layers 260.

In some implementations, in the step of etching the initial pattern layers 210 located in the cutting areas B, the etching selection ratio of the initial pattern layers 210 to the spacing layers 260 is at least 4:1. The etching selection ratio of the initial pattern layers 210 to the spacing layers 260 is relatively large, which can further improve the effect of defining the etching stop positions with the spacing layers 260.

In some implementations, processes for etching the initial pattern layers 210 located in the cutting areas B include an isotropous etching process. The isotropous etching process can reduce damage to other membrane layers.

As an example, the processes for etching the initial pattern layers 210 located in the cutting areas B include a wet etching process or a remote plasma etching process. The wet etching process is prone to realizing isotropous etching, the wet etching process is simple to operate and low in cost, and the wet etching process can further realize the relatively high etching selection ratio. The remote plasma etching process has isotropous etching characteristics; and the remote plasma etching process also has relatively high etching selection, which is beneficial to reduce damage to other membrane layers in the process of etching. A principle of the remote plasma etching process is to form plasma outside an etching chamber (for example: generating plasma by a remote plasma generator), and then introduce the plasma into the etching chamber to perform etching by using a chemical reaction between the plasma and the etched layer. Therefore, an isotropic etching effect can be achieved, and other membrane layers are not damaged because there is no ion bombardment. In other implementations, other possible etching process can also be used for etching the initial pattern layers located in the cutting areas, for example: inductively coupled plasma (ICP) etching or capacitively coupled plasma (CCP) etching, or other etching process.

In some implementations, after the spacing layers 260 are formed and before the initial pattern layers 210 located in the cutting areas B are etched, the forming method further includes: the hard mask layers 240 located in the cutting areas B are removed, to expose tops of the initial pattern layers 210 in the cutting areas B, so as to etch the initial pattern layers 210 in the cutting areas B by using the exposed tops of the initial pattern layers 210.

In some implementations, the target pattern layers 300 are fins; and after the initial pattern layers 210 located in the cutting areas B are etched, the semiconductor structure forming method further includes the steps as follows.

Figure 25:
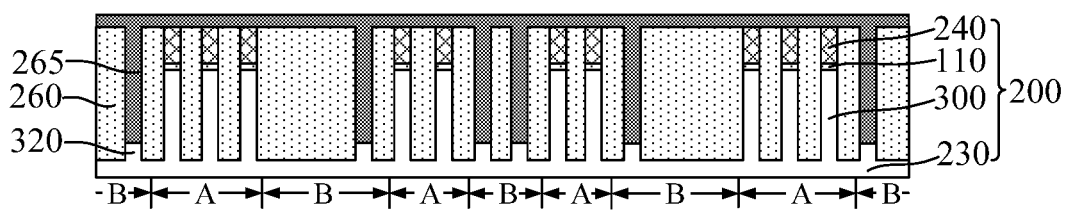
Figure 26:
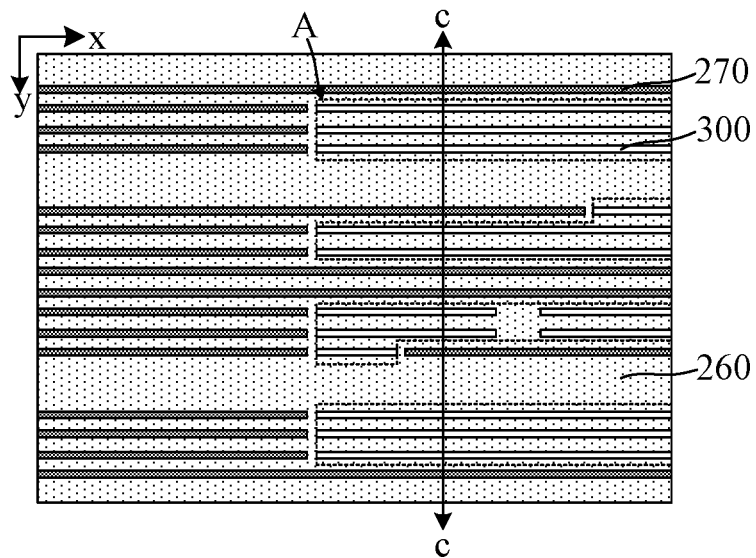
Figure 27:
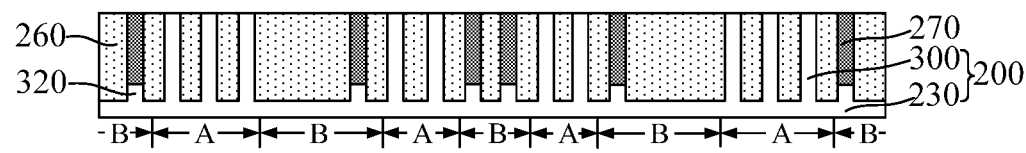

Referring to FIG. 25 to FIG. 27, filling isolation layers 270 are formed in the cutting grooves 30.

By forming the filling isolation layer 270, preparation is made for the subsequent removal of part of the thickness of the filling isolation layers 270 and the spacing layers 260 to form the isolation structures. In some implementations, the material of the filling isolation layers 270 is the same as that of the spacing layers 260, thereby being beneficial to improve process compatibility.

In some implementations, the step of forming the filling isolation layers 270 includes: as shown in FIG. 25, filling isolation material layers 265 filled into the cutting grooves 30 and covering the spacing layers 260 and the hard mask layers 240 are formed. As shown in FIG. 26 and FIG. 27, FIG. 26 is a top view, and FIG. 27 is a diagram of a cross-section at a position cc in FIG. 26, the filling isolation material layers 265 and the spacing layers 260 are planarized using tops of the fins as stop positions.

In some implementations, the process with strong gap filling ability is used for forming the filling isolation material layers 265, thereby improving the filling quality of the filling isolation material layers 265 in the cutting grooves 30. Specifically, processes for forming the filling isolation layers 270 include one or two of a flowable chemical vapor deposition process and an atomic layer deposition process.

In some implementations, processes for planarizing the filling isolation material layers 265 and the spacing layers 260 include a chemical mechanical grinding process.

Figure 28:
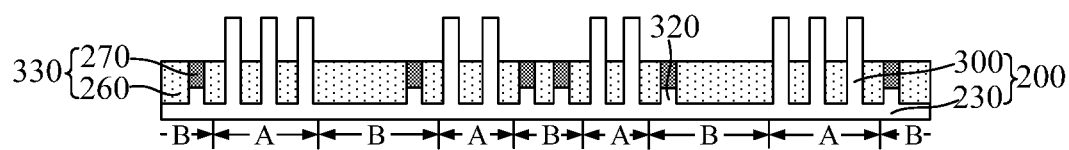

Referring to FIG. 28, part of the thickness of the filling isolation layers 270 and the spacing layers 260 are removed to expose part of side walls of the fins, and the remaining filling isolation layers 270 and the remaining spacing layers 260 are used as the isolation structures 330. The isolation structures 330 are used for isolating the adjacent fins. The isolation structures 330 cover residual dummy fins 320.

According to some implementations, the fin cut process is integrated with the process for forming the isolation structures 330, which is beneficial to improve process integration and process compatibility, and is also beneficial to simplify a process flow and improve production efficiency. It should be noted that some implementations take the operation of retaining part of the spacing layers 260 to form the isolation structures 330 as an example. In other implementations, after the initial pattern layers located in the cutting areas are etched, the forming method may alternatively include: the spacing layers are removed.

Accordingly, the present disclosure further provides a semiconductor structure. FIG. 26 and FIG. 27 show schematic structural diagrams of an embodiment of a semiconductor structure according to the present disclosure. FIG. 26 is a top view, and FIG. 27 is a diagram of a cross-section at a position cc in FIG. 26.

The semiconductor structure includes: a base 200, including target areas A and cutting areas B, where the base 200 includes discrete target pattern layers 300 in the target areas A, the target pattern layers 300 extend along the lateral direction (as shown in the x direction in FIG. 26), and a direction perpendicular to the lateral direction is the longitudinal direction (as shown in the y direction in FIG. 26); cutting grooves 30 (as shown in FIG. 23 and FIG. 24), located on the base 200 in the cutting areas B, where the cutting grooves 30 extend along the lateral direction, and the cutting grooves 30 are connected to the target pattern layers 300 along the lateral direction, or the cutting grooves 30 and the target pattern layers 300 are arranged in parallel at intervals; boundary defining grooves 250 (as shown in FIG. 20), located between the cutting grooves 250 and the target pattern layers 300 along the lateral direction; and spacing layers 260, filled between the adjacent target pattern layers 300, between side walls of the adjacent cutting grooves 30, and between the side walls of the cutting grooves 30 and the target pattern layers 300, and the spacing layers 260 are filled into the boundary defining grooves 250. The cutting grooves 30 are formed by etching the initial pattern layers located in the cutting areas B, and the remaining initial pattern layers located in the target areas A are used as target pattern layers 300.

According to some implementations, by configuring the boundary defining grooves 250, the boundary defining grooves 250 are used for defining boundaries of the target areas A, the initial pattern layers are disconnected at boundary positions of the target areas A and the cutting areas B along the lateral direction; accordingly, the spacing layers 260 are filled between the adjacent target pattern layers 300, between the side walls of the adjacent cutting grooves 30, and between the side walls of the cutting grooves 30 and the target pattern layers 300; the initial pattern layers are separated by the spacing layers 260 at the boundary positions of the target areas A and the target areas B along the lateral direction, and the adjacent initial pattern layers are separated by the spacing layers 260 along the longitudinal direction. In the process of etching the initial pattern layers in the cutting areas B to form the cutting grooves 30, the spacing layers 260 can define etching stop positions along the lateral direction and the longitudinal direction, so that the spacing layers 260 located in the boundary defining grooves 250 and the spacing layers 260 located in the adjacent initial pattern layers along the longitudinal direction can be used as stop layers along the lateral direction and the longitudinal direction respectively, and accordingly self-aligned etching along the lateral direction and the longitudinal direction can be achieved, which is beneficial to enlarge process windows for forming the target pattern layers 300 and reduce process difficulty of forming the target pattern layers 300, and can accurately control critical dimensions and patterns of the target pattern layers 300, thereby improving the cross-section profile quality and the side wall profile quality of the target pattern layers 300.

The base 200 provides a platform for subsequent technical processes. The target areas A are areas 300 where the target pattern layers are located, and the areas on the base 200 other than the target areas A are the cutting areas B. In some implementations, the target pattern layers 300 are fins. The fins are used for forming fin type field-effect transistors. Accordingly, in some implementations, the target areas are active areas (AAs), and the cutting areas B are isolation areas.

In some implementations, the target pattern layers 300 are the fins, so that the cross-section profile quality and the side wall profile quality of the fins are relatively high, and the critical dimensions of the fins are accurately controlled, which is beneficial to improve the performance of FinFET devices.

In some implementations, the base 200 further includes a substrate 230 located at the bottoms of the fins. The fins correspondingly protrude from the substrate 230. In some implementations, the material of the fins and the substrate 230 is silicon.

In other implementations, the target pattern layers may alternatively be pattern layers such as gate structures, channel stack layers in gate-all-around (GAA) transistors, pattern transferring layers or dielectric spacing layers. The pattern transition layer may be a membrane layer structure such as a hard mask layer, and the dielectric spacing layer may be a dielectric layer used for isolating back section metal interconnection line.

The cutting grooves 30 correspond to cut positions of the initial pattern layers. The cutting grooves 30 are formed by etching the initial pattern layers located in the cutting areas B. Therefore, the extension direction of the cutting grooves 30 is the same as that of the target pattern layers 300.

In some implementations, the semiconductor structure further includes: residual dummy fins 320, located at bottoms of the cutting grooves 30. The residual dummy fins 320 are retained in the semiconductor structure, because part of the initial fins are retained as the residual dummy fins 320 when the initial fins located in the cut areas B are etched.

By configuring the residual dummy fins 320, in the subsequent process of forming isolation structures covering part of side walls of the fins on the substrate 230, the residual dummy fins 320 are located between the adjacent fins, which can play a role in dispersing a stress, thereby being beneficial to improve the probability that the fins are bent or tilted due to different stresses. In some implementations, the height of the residual dummy fins 320 is less than or equal to 20% of the height of the fins. As an example, the height of the residual dummy fins 320 is less than or equal to 200 Å.

The boundary defining grooves 250 are used for defining boundaries of the target areas A, so that the initial pattern layers 210 are disconnected at boundary positions of the target areas A and the cutting areas B along the lateral direction. The spacing layers 260 are filled into the boundary defining grooves 250, so that the initial pattern layers are separated by the spacing layers 260 at the boundary positions of the target areas A and the target areas B along the lateral direction. In the process of etching the initial pattern layers located in the cutting areas B to form the cutting grooves 30, the spacing layers 260 located in the boundary defining grooves 250 can define etching stop positions along the lateral direction, which can accurately control the critical dimensions and the patterns of the target pattern layers 300, thereby improving the cross-section profile quality and the side wall profile quality of the target pattern layers 300, and enlarging the process windows for forming the target pattern layers 300.

The spacing layers 260 separate the initial pattern layers at the boundary positions of the target areas A and the cutting areas B along the lateral direction, and separate the longitudinally adjacent initial pattern layers. In the process of etching the initial pattern layers located in the cutting areas B to form the cutting grooves 30, the spacing layers 260 can define the etching stop positions along the lateral direction and the longitudinal direction.

In some implementations, the target pattern layers 300 are fins; and the material of the spacing layers 260 is a dielectric material. In some implementations, the target pattern layers 300 are fins, and the dielectric material is used as the material of the spacing layers 260, so that the spacing layers 260 can be subsequently etched, and the remaining spacing layers 260 can be used for forming isolation structures, to isolate the adjacent fins; and therefore, formation of the spacing layers 260 can be combined with the processes for etching the initial fins located in the cutting areas B and forming the isolation structures, process integration and process compatibility are improved, and the processes can be simplified.

The material of the spacing layers 260 includes at least one of silicon oxide, silicon oxynitride, silicon nitride, silicon carbide, silicon oxycarbide or silicon oxy-carbonitride. As an example, the material of the spacing layers 260 is silicon oxide.

In other implementations, the spacing layers are removed subsequently, which is beneficial to improve the selection flexibility of the material of the spacing layers, for example: the material of the spacing layers may not choose the dielectric material; and the material of the spacing layers may include spin-on carbon, amorphous carbon, an organic dielectric layer, a silicon anti-reflective layer, a deep UV light absorbing oxide layer, a dielectric anti-reflective coating or an advanced patterning film. The material of the spacing layers is easy to be removed, which is beneficial to reduce the difficulty of removal of the spacing layers.

In some implementations, the semiconductor structure further includes: filling isolation layers 270, filled into the cutting grooves 30. Part of the thickness of the filling isolation layers 270 and the spacing layers 260 are removed subsequently to form isolation structures. The isolation structures are used for isolating the adjacent fins, so that the fin cut process is integrated with the process for forming the isolation structures, which is beneficial to improve the process integration and the process compatibility, and is also beneficial to simplify a process flow and improve production efficiency.

In some implementations, the material of the filling isolation layers 270 is the same as that of spacing layers 260, which is beneficial to improve the process compatibility.

The semiconductor structure may be formed by using implementations of a forming method such as those described above, and may alternatively be formed by using other forming methods. The specific description of a semiconductor structure according to these implementations may refer to the corresponding description in embodiments and/or implementations described above, which are not repeated here.

Although the present disclosure is described above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising:
    a base, comprising target areas and cutting areas, wherein the base comprises discrete target pattern layers in the target areas, the target pattern layers extend along a lateral direction, and a direction perpendicular to the lateral direction is a longitudinal direction;
    cutting grooves, located on the base in the cutting areas, wherein the cutting grooves extend along the lateral direction, and the cutting grooves are connected to the target pattern layers along the lateral direction, or the cutting grooves and the target pattern layers are arranged in parallel at intervals;
    boundary defining grooves, located between the cutting grooves and the target pattern layers along the lateral direction; and
    spacing layers, filled between the adjacent target pattern layers, between side walls of the adjacent cutting grooves, and between the side walls of the cutting grooves and the target pattern layers, wherein the spacing layers are filled into the boundary defining grooves.

2. The semiconductor structure according to claim 1, wherein the target pattern layers are fins, channel stack layers, gate structures, pattern transferring layers or dielectric spacing layers.

3. The semiconductor structure according to claim 1, wherein:
    the target areas are active areas, and the cutting areas are isolation areas;
    the target pattern layers are fins; and
    the semiconductor structure further comprises: residual dummy fins, located at bottoms of the cutting grooves.

4. The semiconductor structure according to claim 1, wherein:
    the target areas are active areas, and the cutting areas are isolation areas;
    the target pattern layers are fins;
    the material of the spacing layers is a dielectric material; and
    the semiconductor structure further comprises: filling isolation layers, filled into the cutting grooves.

5. The semiconductor structure according to claim 4, wherein the material of the filling isolation layers is the same as that of the spacing layers.

6. The semiconductor structure according to claim 1, wherein the material of the spacing layers comprises silicon oxide, silicon oxynitride, silicon nitride, silicon carbide, silicon oxycarbide, silicon oxy-carbonitride, spin-on carbon, amorphous carbon, an organic dielectric layer, a silicon anti-reflective layer, a deep UV light absorbing oxide layer, a dielectric anti-reflective coating or an advanced patterning film.

7. A semiconductor structure forming method, comprising:
    providing a base, comprising a target layer, wherein the base comprises target areas for forming target pattern layers and cutting areas corresponding to cutting positions;
    forming discrete mask spacers on the base;
    patterning the target layer using the mask spacers as masks, to form discrete initial pattern layers, wherein the initial pattern layers extend along a lateral direction, a direction perpendicular to the lateral direction is a longitudinal direction, and grooves are formed between the longitudinally adjacent initial pattern layers;
    forming boundary defining grooves that penetrate through the initial pattern layers located at boundary positions of the target areas and the cutting areas along the lateral direction;
    forming spacing layers filled into the grooves and the boundary defining grooves; and
    using the spacing layers located in the boundary defining grooves and the spacing layers located in the grooves as stop layers along the lateral direction and the longitudinal direction respectively, etching the initial pattern layers located in the cutting areas, and using the remaining initial pattern layers located in the target areas as the target pattern layers.

8. The semiconductor structure forming method according to claim 7, wherein:
the step of forming mask spacers comprises:
    forming discrete core layers on the base; and
    forming mask spacers on side walls of the core layers; and
the semiconductor structure forming method further comprises: after the mask spacers are formed and before the target layer is patterned, removing the core layers.

9. The semiconductor structure forming method according to claim 8, wherein:
in the step of forming core layers, the plurality of adjacent core layers form a support core layer, and the single core layer forms a sacrificial core layer; and
the semiconductor structure forming method further comprises: after the core layers are formed and before the mask spacers are formed, removing the sacrificial core layers located in the cutting areas; or
in the step of forming mask spacers, the sacrificial core layers and the mask spacers located on side walls of the sacrificial core layers form sacrificial pattern layers; and after the mask spacers are formed and before the target layer is patterned, removing the sacrificial pattern layers located in the cutting areas.

10. The semiconductor structure forming method according to claim 9, wherein removing the sacrificial pattern layers located in the cutting areas comprises:
after the mask spacers are formed and before the core layers are removed, removing the sacrificial pattern layers located in the cutting areas; or,
after the core layers are removed and before the target layer is patterned, removing the mask spacers located in the sacrificial pattern layers in the cutting areas.

11. The semiconductor structure forming method according to claim 7, wherein:
in the step of providing a base, the base further comprises a hard mask material layer located on the target layer;
after the mask spacers are formed and before the target layer is patterned, the semiconductor structure forming method further comprises: patterning the hard mask material layer using the mask spacers as masks, to form hard mask layers;
the boundary defining grooves further penetrate through the hard mask layers located at boundary positions of the target areas and the cutting areas along the lateral direction;
in the step of forming the spacing layers, the spacing layers cover side walls of the hard mask layers;
after the spacing layers are formed and before the initial pattern layers located in the cutting areas are etched, the semiconductor structure forming method further comprises: removing the hard mask layers located in the cutting areas, to expose tops of the initial pattern layers in the cutting areas.

12. The semiconductor structure forming method according to claim 7, wherein the step of forming boundary defining grooves comprises:
forming boundary defining mask layers covering the initial pattern layers, forming boundary defining openings located at boundary positions of the target areas and the cutting areas along the lateral direction in the boundary defining mask layers;
etching the initial pattern layers along the boundary defining openings using the boundary defining mask layers as masks, to form the boundary defining grooves; and
removing the boundary defining mask layers.

13. The semiconductor structure forming method according to claim 12, wherein processes for etching the initial pattern layer comprise an anisotropic dry etching process along the boundary defining openings.

14. The semiconductor structure forming method according to claim 7, wherein processes for forming the spacing layers comprise at least one of a flowable chemical vapor deposition process, an atomic layer deposition process or a spin-on process.

15. The semiconductor structure forming method according to claim 7, wherein processes for etching the initial pattern layers located in the cutting areas comprise an isotropous etching process.

16. The semiconductor structure forming method according to claim 7, wherein processes for etching the initial pattern layers located in the cutting areas comprise at least one of wet etching, remote plasma etching, inductively coupled plasma etching, or capacitively coupled plasma etching.

17. The semiconductor structure forming method according to claim 7, wherein in the step of etching the initial pattern layers located in the cutting areas, the etching selection ratio of the initial pattern layers to the spacing layers is at least 4:1.

18. The semiconductor structure forming method according to claim 7, wherein the target pattern layers are fins, channel stack layers, gate structures, pattern transferring layers or dielectric spacing layers.

19. The semiconductor structure forming method according to claim 7, wherein:
the target areas are active areas, and the cutting areas are isolation areas;
the initial pattern layers are initial fins, and the target pattern layers are fins;
in the process of etching the initial pattern layers located in the cutting areas, the initial fins located in the cutting areas are etched, to form residual dummy fins located in the cutting areas.

20. The semiconductor structure forming method according to claim 7, wherein:
the target areas are active areas, and the cutting areas are isolation areas; the initial pattern layers are initial fins, and the target pattern layers are fins; the material of the spacing layers is a dielectric material;
in the step of etching the initial pattern layers located in the cutting areas, cutting grooves are formed in the spacing layers; and
after the initial pattern layers located in the cutting areas are etched, the semiconductor structure forming method further comprises:
    forming filling isolation layers in the cutting grooves; and
    removing part of the thickness of the filling isolation layers and the spacing layers, to expose part of side walls of the fins, and using the remaining filling isolation layers and the remaining spacing layers as isolation structures.

21. The semiconductor structure forming method according to claim 20, wherein processes for forming the filling isolation layers comprise at least one of a flowable chemical vapor deposition process or an atomic layer deposition process.

\* \* \* \* \*